(12) United States Patent
Toshima et al.

(10) Patent No.: US 7,731,799 B2
(45) Date of Patent: Jun. 8, 2010

(54) SUBSTRATE PROCESSING METHOD, SUBSTRATE PROCESSING APPARATUS AND COMPUTER-READABLE MEMORY MEDIUM

(75) Inventors: Takayuki Toshima, Nirasaki (JP); Tadashi Iino, Nirasaki (JP); Yusuke Saito, Nirasaki (JP); Mitsunori Nakamori, Nirasaki (JP); Noritaka Uchida, Tosu (JP); Takehiko Orii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1051 days.

(21) Appl. No.: 10/579,423

(22) PCT Filed: Dec. 7, 2004

(86) PCT No.: PCT/JP2004/018176

§ 371 (c)(1),
(2), (4) Date: May 11, 2006

(87) PCT Pub. No.: WO2005/059976

PCT Pub. Date: Jun. 30, 2005

(65) Prior Publication Data

US 2007/0074747 A1 Apr. 5, 2007

(30) Foreign Application Priority Data

Dec. 18, 2003 (JP) ............................. 2003-420785

(51) Int. Cl.
*B08B 3/08* (2006.01)

(52) U.S. Cl. ............................ 134/1.3; 134/26; 134/30
(58) Field of Classification Search ....................... None
See application file for complete search history.

(56) References Cited

U.S. PATENT DOCUMENTS

| 6,613,692 | B1 * | 9/2003 | Toshima et al. ............. 438/745 |
| 6,616,773 | B1 | 9/2003 | Kuzumoto et al. |
| 2001/0004898 | A1 * | 6/2001 | Kamikawa et al. ............. 134/2 |
| 2002/0185225 | A1 * | 12/2002 | Toshima et al. ........ 156/345.33 |
| 2003/0170949 | A1 | 9/2003 | Chouno et al. |

FOREIGN PATENT DOCUMENTS

| JP | 2001-223206 | 8/2001 |
| JP | 2002-18379 | 1/2002 |
| JP | 2002-134401 | 5/2002 |
| JP | 2002-184741 | 6/2002 |
| JP | 2002-231696 | 8/2002 |
| JP | 2003-273085 | 9/2003 |
| JP | 2003-332322 | 11/2003 |

* cited by examiner

*Primary Examiner*—Michael Barr
*Assistant Examiner*—Ryan Coleman (57) ABSTRACT

A substrate processing method which removes an ArF resist film from a wafer having the ArF resist film. As an ultraviolet irradiation process is performed on the ArF resist film, and then an ozone gas and water vapor are fed to the ArF resist film, the ArF resist film is altered in a water-soluble state. Thereafter, the ArF resist film is removed from the substrate by feeding pure water to the ArF resist film altered into the water-soluble state.

23 Claims, 9 Drawing Sheets

SUBSTRATE PROCESSING METHOD, SUBSTRATE PROCESSING APPARATUS AND COMPUTER-READABLE MEMORY MEDIUM

CROSS-REFERENCE TO RELATED APPLICATIONS

This is a national stage under 35 USC §371 of International Application PCT/JP2004/018176, filed on Dec. 8, 2004, which claims priority benefit of Japanese Patent Application No. 2003-420785 filed Dec. 18, 2003. The entire contents of those applications are hereby incorporated by reference herein.

TECHNICAL FIELD

The present invention relates to a substrate processing method for removing a hard-removable film, such as an ArF resist, an antireflection film, or a high-dose-ion-implanted film, provided on a substrate, from the substrate, a substrate processing apparatus for executing the substrate processing method, and a computer-readable memory medium.

BACKGROUND ART

In the fabrication process of a semiconductor device, shortening the waveform of a light to be used at a photolithography step is in progress for the high integration of the semiconductor device, and nowadays, a technology which uses an ArF excimer laser as a light source is about to be put to a practical use. A photolithography step using an ArF excimer laser, like a conventional photolithography step using g rays, i rays or the like, is executed by forming a resist film (hereinafter called "ArF resist film") which is selectively exposed by the light of the ArF excimer laser, exposing the ArF resist film with a reticle on which a predetermined circuit pattern is formed, and then developing the film.

With the use of the ArF resist film patterned in this manner as a mask, various processes of forming trench interconnection elements, such as an etching process, a process of burying a metallic material by a CVD method, and an ion implantation process, are carried out. After execution of such processes, the ArF resist film which has become unnecessary should be removed. As a conventional method of removing the ArF resist film that becomes unneeded, for example, Unexamined Japanese Patent Application KOKAI Publication No. 2002-184741 discloses a method of altering a resist film to be water-soluble under atmosphere of water vapor and an ozone gas, and removing the resist film altered to be water-soluble by a rinse process.

The separation rate in the process for the ArF resist film using an ozone gas and water vapor is, however, extremely low. Therefore, it is difficult to employ that process in a production process which uses an ArF resist film. In general, an antireflection film (BARC) for preventing the reflection of an ArF excimer laser is formed as the base of the ArF resist film, but it is also difficult to remove the antireflection film by the process using ozone gas and water vapor. Further, not limited to the ArF resist film, as a resist film undergone an ion implantation process at a high dosage is hardened by implanted ions, it is also difficult to remove the resist film by only the process using ozone gas and water vapor.

DISCLOSURE OF INVENTION

The present invention has been made in view of the above-described circumstances, and it is an object of the invention to provide a substrate processing method which can facilitate removal of hard-removable resist film, antireflection film, or the like which is formed at a photolithography step, and becomes unnecessary after an etching process, an ion implantation process, a conductive-film formation process, or the like. Another object of the invention is to provide a substrate processing apparatus for executing such a substrate processing method, and a computer-readable recording medium which is used in controlling the substrate processing apparatus.

According to the first aspect of the invention, there is provided a substrate processing method for removing an ArF resist film from a substrate having the ArF resist film, comprising the steps of:

irradiating an ultraviolet ray having a predetermined wavelength to the ArF resist film;

altering the ArF resist film irradiated with the ultraviolet ray into a water-soluble form by placing the substrate in a chamber and feeding an ozone gas and water vapor to the chamber; and removing the ArF resist film from the substrate by feeding pure water to the ArF resist film altered into the water-soluble form.

According to the substrate processing method, it is preferable that when the substrate further has an antireflection film compatible with an ArF ray, the antireflection film together with the ArF resist film should be irradiated with an ultraviolet ray, become water-soluble by the ozone gas and the water vapor, and be collectively removing together with the ArF resist film from the substrate by the pure water.

According to the second aspect of the invention, there is provided a substrate processing method for removing an antireflection film from a substrate having the antireflection film, comprising the steps of:

irradiating an ultraviolet ray having a predetermined wavelength to the antireflection film;

altering the antireflection film irradiated with the ultraviolet ray into a water-soluble state by placing the substrate in a chamber and feeding an ozone gas and water vapor to the chamber; and removing the antireflection film from the substrate by feeding pure water to the reflection film altered into the water-soluble form.

According to the third aspect of the invention, there is provided a substrate processing method for removing a resist film from a substrate having the resist film undergone an ion implantation process at a high dose, comprising the steps of:

irradiating an ultraviolet ray having a predetermined wavelength to the resist film;

altering the resist film irradiated with the ultraviolet ray into a water-soluble form by placing the substrate in a chamber and feeding an ozone gas and water vapor to the chamber; and removing the resist film from the substrate by feeding pure water to the resist film altered into the water-soluble form.

The substrate processing method according to the third aspect is preferably used when a dosage in the ion implantation process is equal to or greater than $1 \times 10^{15}/cm^2$.

According to the substrate processing methods of to the first to third aspects, it is preferable that when the water vapor and the ozone gas should be fed to the chamber, a feed amount of ozone gas with respect to the water vapor is decreased while the water vapor is fed to the chamber at a constant flow rate in such a way as not to cause dew condensation on the substrate at the step of altering an ArF resist film, an antireflection film, or a high-dose-ion-implanted film to a water-soluble form. This can accelerate modification of a film like an ArF resist film, and facilitates separation with pure water. It is preferable that a method of periodically suspending feeding of the ozone gas to the chamber should be used as a mode of feeding ozone gas in such a processing method. A method of preventing dew condensation in the chamber, which is preferably used, is a method of acquiring, beforehand, a pressure at which dew condensation occurs in the chamber when an amount of the water vapor to be fed to the chamber is made constant with an interior of the chamber held at a predetermined temperature, and, in an actual substrate process, controlling the feed amount of ozone gas while a pressure in the chamber is measured in such a way that the measured pressure does not exceed the pressure at which the dew condensation occurs, measured beforehand.

In those substrate processing methods, it is preferable that the chamber should be evacuated in such a way as to keep an interior of the chamber at a constant positive pressure when the water vapor and the ozone gas are fed to the chamber. This can accelerate modification of a film like an ArF resist film.

By the way, recently, materials for an ArF resist film or the like are significantly changed (advanced), so that the substrate processing methods according to the first to third aspects have brought about a new problem that an ArF resist film or the like cannot be separated, or the separation rate becomes longer, thus reducing productivity. To improve the separation rate of a film made of such a material, therefore, the invention provides the following substrate processing methods according to the fourth to sixth aspects.

According to the fourth aspect of the invention, there is provided a substrate processing method for removing an ArF resist film from a substrate having the ArF resist film, comprising the steps of:

irradiating an ultraviolet ray having a predetermined wavelength to the ArF resist film;

altering the ArF resist film irradiated with the ultraviolet ray in such a way as to be water-soluble with a predetermined chemical solution by placing the substrate in a chamber and feeding an ozone gas and water vapor to the chamber; and removing the ArF resist film from the substrate by feeding the chemical solution to the altered ArF resist film.

According to the fifth aspect of the invention, there is provided a substrate processing method for removing an antireflection film from a substrate having the antireflection film, comprising the steps of:

irradiating an ultraviolet ray having a predetermined wavelength to the antireflection film;

altering the antireflection film irradiated with the ultraviolet ray in such a way as to be soluble with a predetermined chemical solution by placing the substrate in a chamber and feeding an ozone gas and water vapor to the chamber; and removing the antireflection film from the substrate by feeding the chemical solution to the altered antireflection film.

According to the sixth aspect of the invention, there is provided a substrate processing method for removing a resist film from a substrate having the resist film undergone an ion implantation process at a high dose, comprising the steps of:

irradiating an ultraviolet ray having a predetermined wavelength to the resist film;

altering the resist film irradiated with the ultraviolet ray in such a way as to be soluble with a predetermined chemical solution by placing the substrate in a chamber and feeding an ozone gas and water vapor to the chamber; and removing the resist film from the substrate by feeding the chemical solution to the altered resist film.

The substrate processing methods according to the fourth to sixth aspects separate the film which is altered using an alkaline chemical liquid in place of pure water after the substrate is processed with the water vapor and ozone gas in the substrate processing methods according to the first to third aspects. As the alkaline chemical liquid, an APM solution, an ammonium hydroxide aqueous liquid, a tetramethyl ammonium hydroxide (TMAH) aqueous solution or the like is preferably used.

In the substrate processing methods according to the first to sixth aspects, an ultraviolet lamp or an excimer laser with a wavelength of 172 nm to 193 nm is preferably used for ultraviolet irradiation.

The invention provides a substrate processing apparatus for executing the substrate processing methods according to the invention first to sixth aspects. That is, according to the seventh aspect, there is provided a substrate processing apparatus comprising:

an ultraviolet irradiation section which irradiates an ultraviolet ray to a substrate having any one film of an ArF resist film, an antireflection film, and a high-dose-ion-implanted resist film;

a chamber which has a heating mechanism and retains the substrate irradiated with the ultraviolet ray;

a water vapor feeder which feeds water vapor to the chamber;

an ozone gas feeder which feeds ozone gas to the chamber; and a control section which controls the chamber, the water vapor feeder, and the ozone gas feeder in such a way that an interior of the chamber retaining the substrate is kept at a predetermined temperature and the water vapor and the ozone gas are fed into the chamber at predetermined flow rates.

It is preferable that in the substrate processing apparatus, the control section should be so structured as to perform control to decrease a feed amount of ozone gas into the chamber while feeding the water vapor into the chamber at a constant flow rate in such a way as not to cause dew condensation on the substrate in the chamber; for example, the control section periodically suspends feeding of the ozone gas to the chamber. It is preferable that the substrate processing apparatus should be structured to further comprise a liquid process section which performs a liquid process on the substrate by using any one of pure water, an APM solution, an ammonium hydroxide aqueous solution, or a tetramethyl ammonium hydroxide (TMAH) aqueous solution. Accordingly, the process on the substrate with the water vapor and ozone gas and the subsequent liquid process can be executed smoothly.

The invention provides a computer-readable recording medium having recorded a program for allowing a computer to control the substrate processing apparatus. That is, according to the eighth aspect of the invention, there is provided a computer-readable recording medium recording a program for allowing a computer that controls a substrate processing apparatus which processes a substrate placed in a chamber having a heating mechanism with water vapor and ozone gas to execute the processes of (a) placing a substrate having any one of an ArF resist film, an antireflection film, and a high-dose-ion-implanted resist film, which has undergone an ultraviolet irradiation process in the chamber, (b) keeping an interior of the chamber at a predetermined temperature, and (c) altering the film so as to be soluble with a predetermined process liquid by reducing a feed amount of ozone gas into the chamber while the water vapor is fed into the chamber at a constant flow rate in such a way as not to cause dew condensation on the substrate.

According to the subject matters, it is possible to remove hard-removable films, such as an ArF resist film, an antireflection film, and a resist film undergone a highly-dosed ion implantation, without damaging a portion other than a target to be removed. It is possible to improve the removing rate of the hard-removable film by creating a condition where there is a lot of water vapor in the chamber by reducing the amount of ozone gas with respect to water vapor, when the substrate is processed with the water vapor and the ozone gas. The use of an alkaline chemical solution in a liquid process after processing the substrate with the water vapor and the ozone gas can make removal of the hard-removable film easier, thus further shortening the throughput of the apparatus.

BRIEF DESCRIPTION OF DRAWINGS

[FIG. 1]

[FIG. 2]

[FIG. 3]

[FIG. 4]

[FIG. 5]

[FIG. 6A]

[FIG. 6B]

[FIG. 6C]

[FIG. 6D]

[FIG. 6E]

[FIG. 7]

[FIG. 8]

BEST MODE FOR CARRYING OUT THE INVENTION

Figure 1:
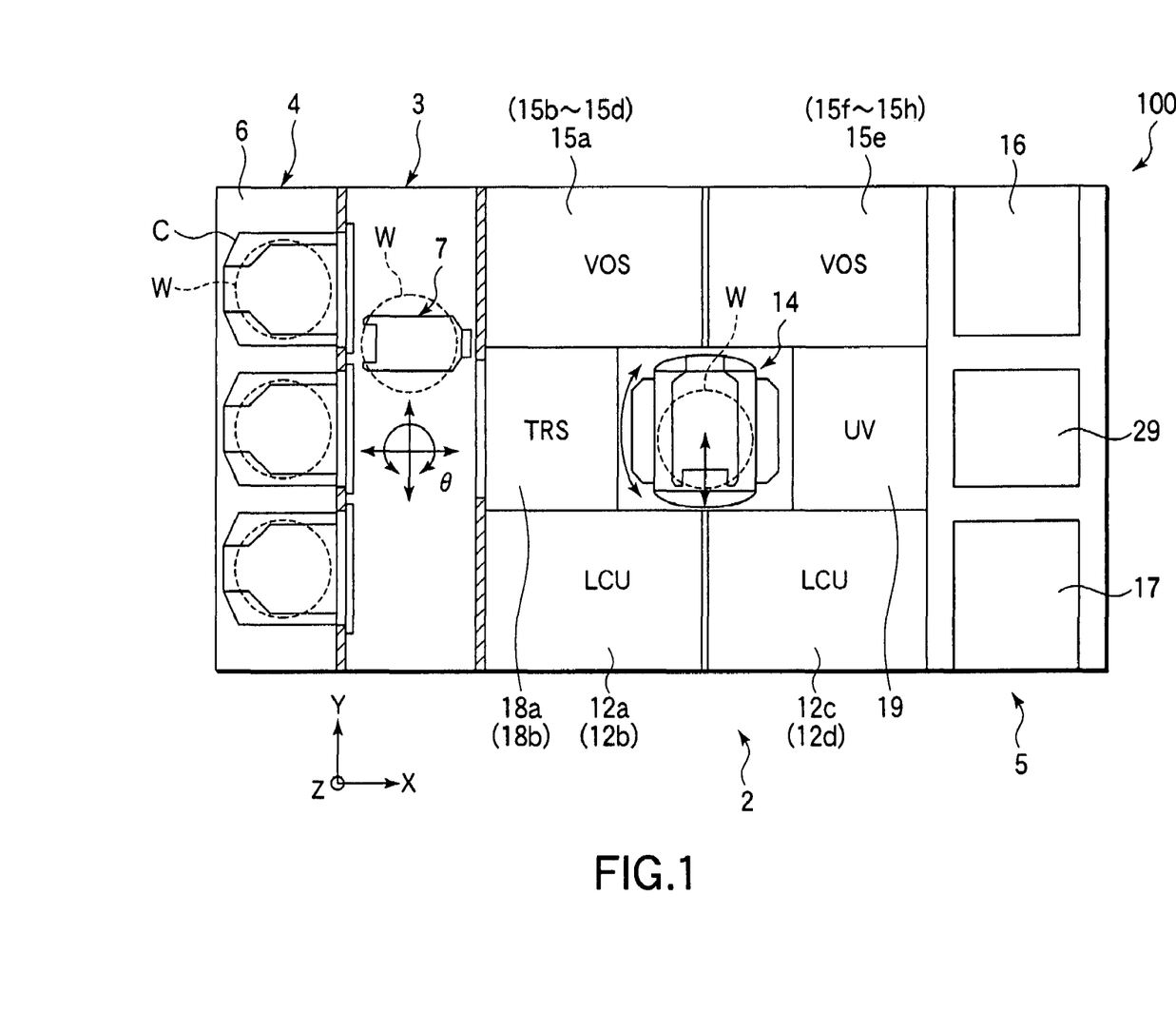
FIG. 1 is A schematic plan view of a film removal system.

An embodiment of the present invention will be described in detail referring to the accompanying drawings. FIG. 1 is a plan view showing the schematic structure of a film removal system 100 for removing an ArF resist film, an antireflection film (BARC) for an ArF wave, a resist film ion-implanted at a high dosage (hereinafter called "ArF resist film or the like") or the like which becomes undesirable in the manufacturing process for a semiconductor device.

The film removal system 100 has a carrier station 4 in which a carrier C retaining wafers W transferred from another processing system or the like, and which transfers the carrier C with the wafers W undergone a process in the film removal system 100 to a processing system or the like which executes the next process; a process station 2 with a plurality of process units for executing a modification process of an ArF resist film or the like provided on a wafer W, a subsequent removal process, and the like; a transfer station 3 which transfers the wafers W between the process station 2 and the carrier station 4; and a chemical station 5 which produces, prepares, and stores a chemical solution, pure water, a gas, or the like to be used by the process station 2.

The carrier station 4 has a stage 6 where carriers C can be mounted at three locations along the Y direction in the diagram. Wafers W are retained in the carrier C in an approximately horizontal state at a constant interval in a vertical direction (Z direction). A control section (computer) for controlling processes of the wafers W in the film removal system 100 is incorporated in space below the stage 6. Provided on the transfer station 3 side is a wafer transfer apparatus 7 which transfers the wafer W between the carrier C mounted on the stage 6 of the carrier station 4 and later-discussed wafer mount units (TRS) 18a, 18b which are provided at the process station 2.

The wafer mount units (TRS) 18a, 18b vertically stacked in two stages (18b disposed below 18a) are disposed at the transfer station 3 side of the process station 2. A main wafer transfer apparatus 14 which transfers the wafer W in the process station 2 is provided at the approximate center of the process station 2. An ultraviolet irradiation unit (UV) 19 which performs an ultraviolet irradiation process on an ArF resist film or the like formed on the surface of the wafer W is disposed on the chemical station 5 side of the process station 2.

Figure 2:
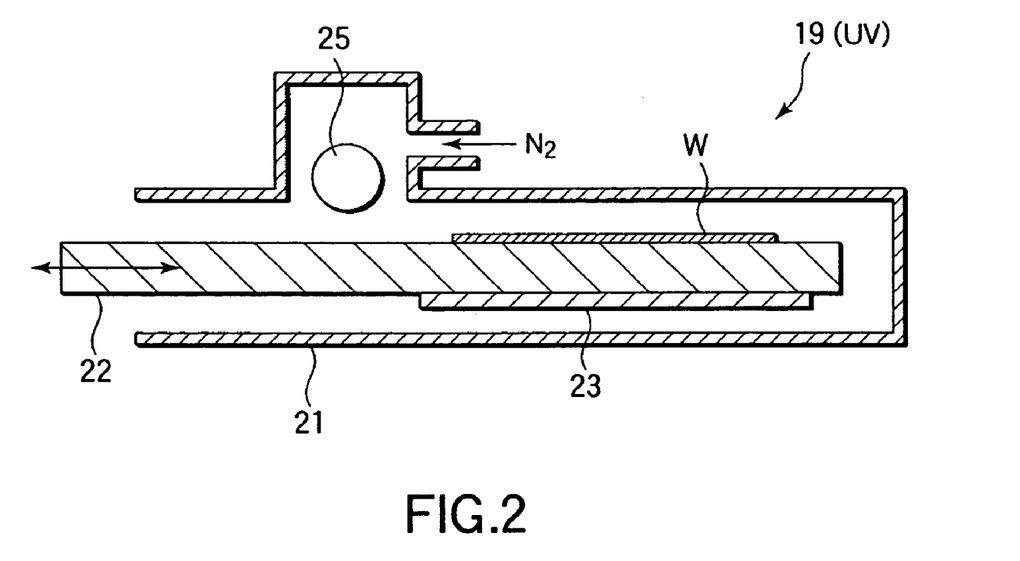
FIG. 2 is A schematic cross-sectional view of an ultraviolet irradiation unit (UV).

A vertical cross-sectional view showing the schematic structure of the ultraviolet irradiation unit (UV) 19 is shown in FIG. 2. The ultraviolet irradiation unit (UV) 19 has a stage 22 on which a wafer W is mounted, a heater 23 which heats up the stage 22, and an ultraviolet light source 25, which irradiates the surface of the wafer W mounted on the stage 22 with ultraviolet rays in a casing 21 whose one side face is open.

It is preferable that an ultraviolet lamp or an excimer laser, which has a luminous wavelength of 172 nm to 193 nm, should be used as the ultraviolet light source 25, and is more preferable that an ArF excimer laser should be used. This is because that the luminous wavelength of the ultraviolet light source 25 is close to or the same as the exposure wavelength, and is likely to change the molecular structure of an ArF resist film or the like. As the heater 23 is heated and the wafer W is heated through the stage 22, the temperature of the wafer W can be made uniform in the plane, and the molecular structure of the ArF resist film or the like can be evenly changed by ultraviolet irradiation.

The stage 22 is horizontally slidable rightward and leftward, and the ultraviolet light source 25 can emit ultraviolet rays toward the stage 22 linearly or in a remove form with a direction vertical to the paper face being as the lengthwise direction, so that as the stage 22 is slid rightward and leftward while an ultraviolet is emitted from the ultraviolet light source 25 to the stage 22, the ultraviolet rays are irradiated to the surface of the wafer W mounted on the stage 22. A nitrogen gas ($N_2$ gas) can be supplied in the casing 21, so as to be able to reduce the oxygen concentration in the casing 21.

Eight film modification units (VOS) 15a to 15h which perform a process on the wafer W undergone the ultraviolet irradiation process with an ozone gas ($O_3$ gas) and water vapor are disposed in two columns and four rows on the rear face side of the process station 2 (15b to 15d are disposed and one on another under 15a, and 15f to 15h are disposed one on another under 15e).

Figure 3:
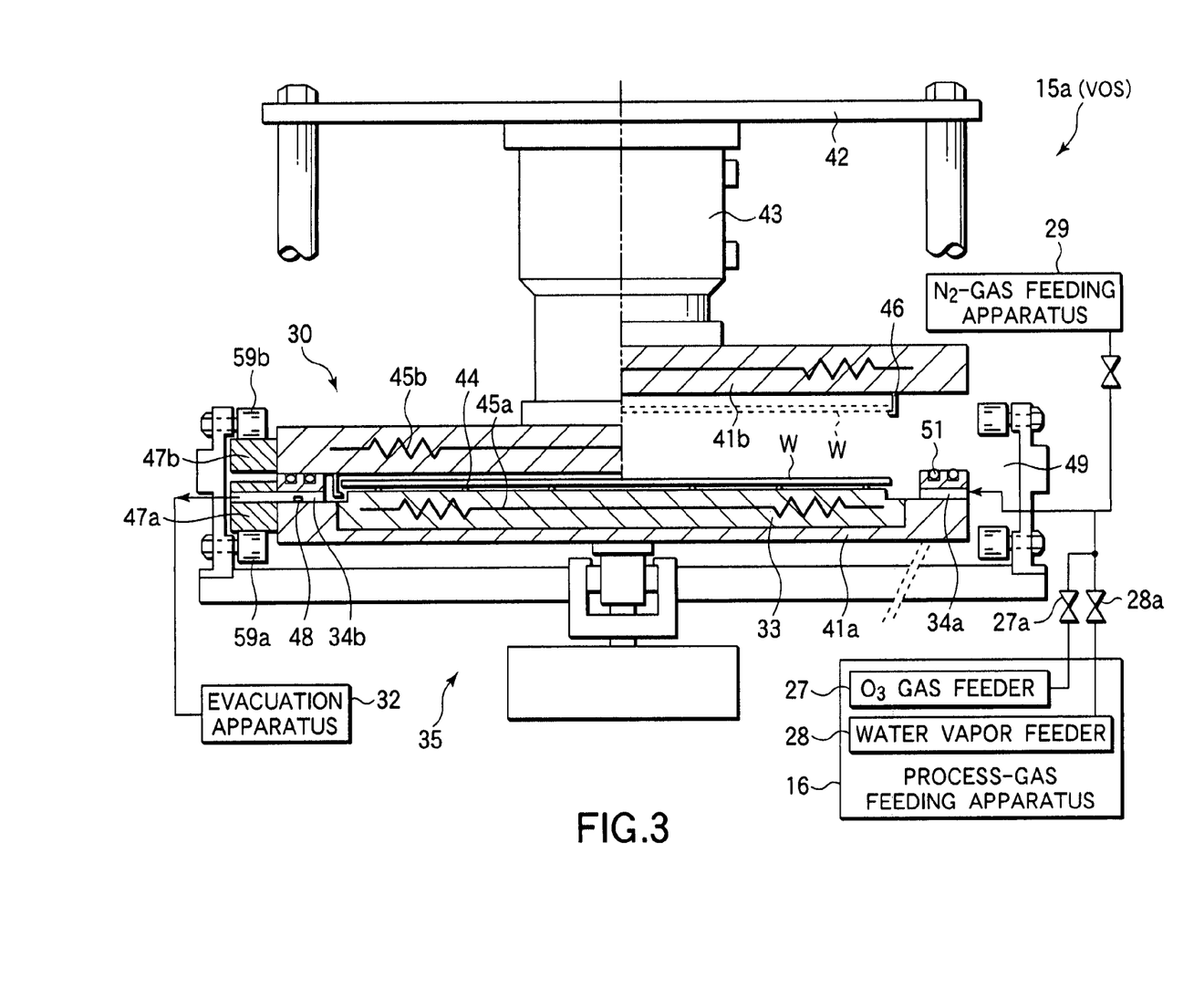
FIG. 3 is A schematic cross-sectional view of a film modification unit (VOS).

FIG. 3 shows a vertical cross-sectional view showing the schematic structure of the film modification unit (VOS) 15a. The film modification unit (VOS) 15a has a chamber 30 which retains wafers W the chamber 30 comprises a fixed lower container 41a, and a lid 41b which covers the upper face of the lower container 41a, and the lid 41b can be moved up and down by a cylinder 43 which is fixed to a frame 42 of the film modification unit (VOS) 15a.

An O ring 51 is disposed on the upper face of an upright portion at the peripheral edge of the lower container 41a. As the lid 41b is moved down by driving the cylinder 43, the peripheral edge of the bottom side of the lid 41b abuts on the upper face of the upright portion at the peripheral edge of the lower container 41a, and the O ring 51 is compressed, thereby forming a sealed process space in the chamber 30.

A stage 33 on which a wafer W is to be mounted is provided on the lower container 41a, and a plurality of proximity pins 44 which support the wafer W are provided at plural locations of the surface of the stage 33. A heater 45a is embedded in the stage 33, and a heater 45b is embedded in the lid 41b, thereby making it possible to respectively keep the stage 33 and the lid 41b at predetermined temperatures. In this manner, the interior of the chamber 30 can be held at the predetermined temperature, and the temperature of the wafer W can be held constant.

Claw members 46 which support the wafer W are provided on the bottom side of the lid 41b at, for example, three locations (FIG. 3 illustrates only two locations). The main wafer transfer apparatus 14 transfers the wafer W to the claw members 46. As the lid 41b is moved down with the claw members 46 holding the wafer W, the wafer W is transferred to the proximity pins 44 provided on the stage 33 during the downward movement.

A gas inlet 34a for introducing an $O_3$ gas and water vapor inside, and a gas outlet 34b for discharging the $O_3$ gas and the water vapor out are provided on the lower container 41a in such a way that the $O_3$ gas and the water vapor flow approximately horizontally in the changer 30. In FIG. 3, the height positions of the gas inlet 34a and the gas outlet 34b are shown lower than the height of the wafer W mounted on the proximity pins 44, but the gas inlet 34a and the gas outlet 34b may be provided higher than those positions.

A process-gas feeding apparatus 16, which is connected to the gas inlet 34a of the chamber 30, and feeds the $O_3$ gas and the water vapor to the chamber 30, has an $O_3$ gas feeder 27 which feeds the $O_3$ gas produced by the ozonization of an oxygen gas ($O_2$ gas) to the chamber 30, and a water vapor feeder 28 which vaporizes pure water to generate water vapor, and send the vapor to the chamber 30. For example, the $O_3$ gas is fed to the chamber 30 from the $O_3$ gas feeder 27 by performing the open/close operation of an open/close valve 27a provided on a feed line. Likewise, the water vapor is fed to the chamber 30 from the water vapor feeder 28 by performing the open/close operation of an open/close valve 28a provided on a feed line. Therefore, when the open/close valve 28a is opened, and the open/close valve 27a is closed, only the water vapor is fed to the chambers 30 provided on the film modification units (VOS) 15a to 15h.

An evacuation apparatus 32 connected to the gas outlet 34b for evacuating the interior of the chamber 30 has an apparatus for carrying out forced evacuation, such as a vacuum pump or an aspirator, and a variable valve for adjusting the flow rate of the gas to be evacuated from the chamber 30. In a case where the interior of the chamber 30 is held at a positive pressure with the gas being continuously fed into the chamber 30, only adjustment of the variable valve should be performed without driving the vacuum pump or the like.

A pressure sensor 48 for measuring an evacuation pressure (same as the pressure in the chamber 30) is mounted at the gas outlet 34b provided on the chamber 30. The mount location of the pressure sensor 48 is not limited to this, and may be any location where the internal pressure of the chamber 30 can be measured.

As will be discussed later, it is preferable that the process of the wafer W with the process gas should be carried out while the interior of the chamber 30 is held at a constant positive pressure. Accordingly, to prevent the process gas from leaking out from the chamber 30 through space between the lower container 41a and the lid 41b, sealing of the lower container 41a and the lid 41b is carried out not only depending on the pressing force of the cylinder 43, but also by tightening protrusions 47a, 47b, provided on the end surfaces of the lower container 41a and the lid 41b, with a lock mechanism 35.

A pair of protrusions 47a, 47b overlap in the vertical direction, and for example, four pairs of protrusions 47a, 47b are provided at the outer periphery of the chamber 30 at equal intervals, with gap portions 49 (see the right-hand portion of FIG. 3) are formed between the individual pairs. The lock mechanism 35 puts the lower container 41a and the lid 41b in close contact with each other by holding the protrusions 47a, 47b between rollers 59a, 59b, but can freely lift the lid 41b up and down when the rollers 59a, 59b are moved to the locations of the gap portions 49.

Liquid process units (LCU) 12a to 12d, which perform a liquid process on wafers W undergone the processes in the film modification units (VOS) 15a to 15h, are laid out in front of the process station 2 in two columns and 2 rows (12b being disposed below 12a, and 12d being disposed below 12c). Although detailed structures of the liquid process units (LCU) 12a to 12d are not illustrated, each has a rotatable spin chuck which holds the wafer W, a cup which surrounds the spin chuck, a chemical liquid nozzle which feeds an alkaline chemical liquid to the surface of the wafer W held by the spin chuck, a pure water nozzle which feeds pure water, and a gas spray nozzle which sprays a dry gas onto the wafer W at the time of spin drying after a rinse process with pure water.

The chemical station 5 is provided with the process-gas feeding apparatus 16 already explained; an $N_2$-gas feeding apparatus 29 for feeding an $N_2$ gas to purge the interiors of the chambers 30 provided in the film modification units (VOS) 15a to 15h; and an $N_2$ gas to be fed to the gas spray nozzles of the liquid process units (LCU) 12a to 12d, to the individual units, and a process-liquid feeding apparatus 17 which feeds pure water and an alkaline chemical liquid to the liquid process units (LCU) 12a to 12d. When an $O_3$ gas and water vapor are fed to the chamber 30 from the process-gas feeding apparatus 16, a predetermined amount of $N_2$ gas may be simultaneously fed to the chamber 30 within the range which does not adversely affect the modification of an ArF resist film or the like by the $O_3$ gas and the water vapor.

Figure 4:
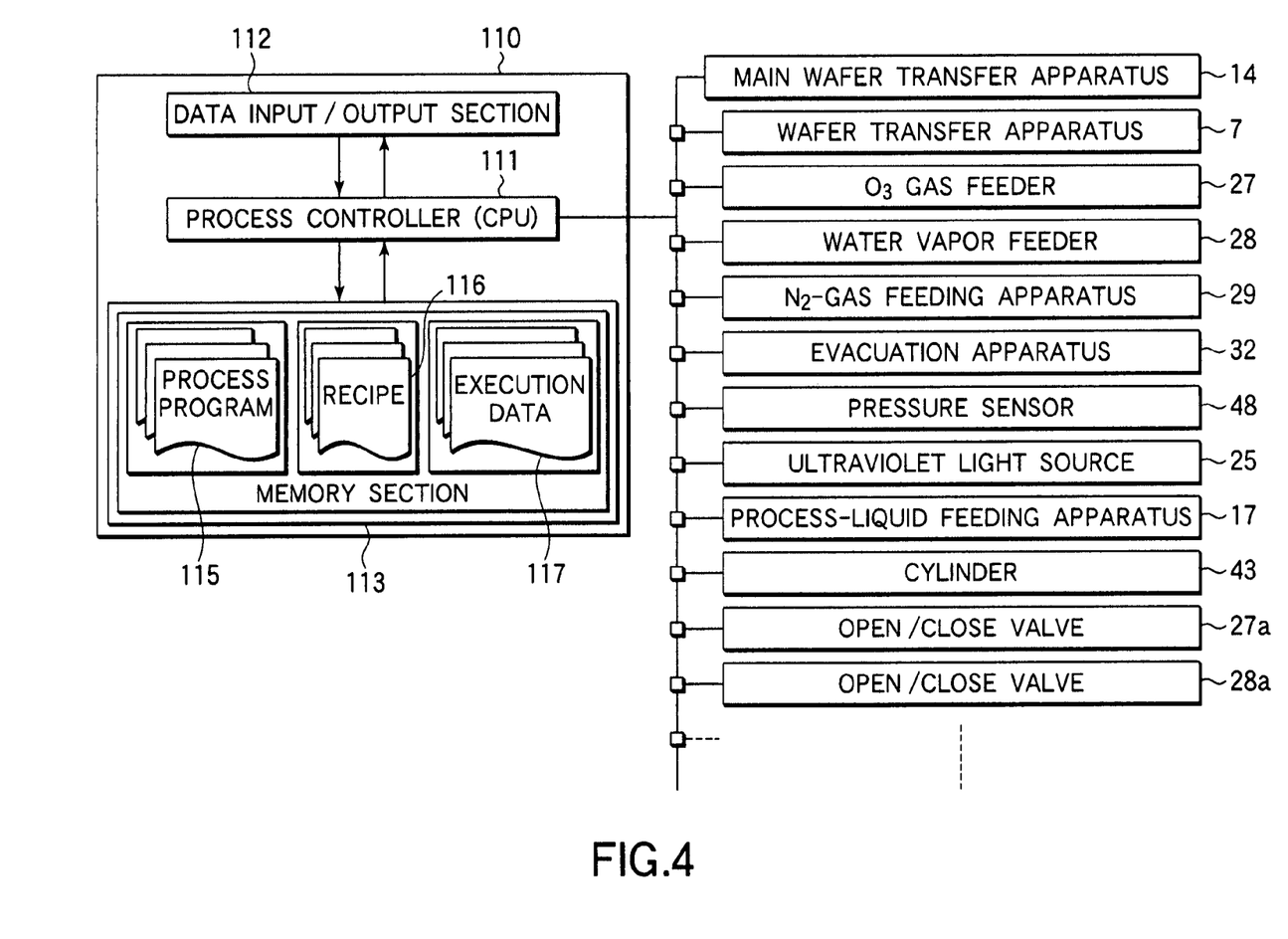
FIG. 4 is A diagram showing the schematic structure of a control system in the film removal system.

FIG. 4 shows the schematic structure of the control system of the film removal system 100. A control section (that is, a computer) 110 for controlling the process for the wafer W by the film removal system 100 has a process controller (CPU) 111, a data input/output section 112 including, for example, a keyboard for a process manager to perform a command input operation or the like for determining process conditions or the like of the wafer W, and a display or the like which visualizes and displays the computation result by the process controller (CPU) 111, the progress status or the like of the rinse process; and a memory section 113 having stored programs and recipes for controlling the film removal system 100, and data or the like about executed processes.

Specifically, the memory section 113 stores process programs 115 for causing the process controller (CPU) 111 to execute control of, for example, the transfer of the wafer W in the film removal system 100, various electrical equipments which constitute individual process units, and mechanisms for mechanically driving them, the supply and stop of an $O_3$ gas, water vapor, pure water, and the like, to perform a series of processes from the ultraviolet irradiation process, the film modification process with an $O_3$ gas and water vapor, and the liquid process for removing a film by pure water or an alkaline chemical solution with respect to the wafer W, to be discussed in detail later, and recipes 116 having recorded time allocations, a transfer route, selection of pure water and an alkaline chemical solution, the feed flow rate and times thereof, the feed amount of an $N_2$ gas, and the like in the series of the processes. The programs 115 and the recipes 116 are stored in, for example, a fixed storage, such as a hard disk (HD) or a memory (RAM or the like), and various portable recording media, such as a CD-ROM (or a CD-R or the like), a DVD-ROM (or a DVD-R or the like), and an MO disk, and are readable by the process controller (CPU) 111.

The memory section 113 can stored data about a process executed by the film removal system 100, for example, execution data 117, such as the lot number of the wafer W, the used process recipe, the processing date, and existence or nonexistence of an operation failure of various driving mechanisms in process. Such execution data 117 can be copied and transferred in various portable recording media, such as a CD-R, and an MO disk.

The process controller (CPU) 111 reads out the process program 115 and the recipe 116, and transmits, for example, a control signal for the transfer of the wafer W to the wafer transfer apparatus 7 and the main wafer transfer apparatus 14, a control signal for turning the ultraviolet light source 25 on/off to the ultraviolet irradiation unit (UV) 19, a control signal for opening and closing the chambers 30 provided on the film modification units (VOS) 15a to 15h to the cylinder 43, a control signal for feeding and stopping an $O_3$ gas and water vapor to the chamber 30 to the $O_3$ gas feeder 27 and the water vapor feeder 28, and a control signal for adjusting the feed flow rates of pure water and chemical liquid to the wafers W in the liquid process units (LCU) 12a to 12d to the process-liquid feeding apparatus 17.

In the processes in the film modification units (VOS) 15a to 15h, it is preferable that the process controller (CPU) 111 should be so structured as to monitor the processes and generate an alarm if any trouble occurs, based on the value measured by the pressure sensor 48. It is also preferable that various mechanisms and the like which constitute the film removal system 100 should be structured in such a manner as to execute bidirectional communications for feeding data representing the execution of the operations of the various mechanisms constituting the film removal system 100 to the process controller (CPU) 111. FIG. 3 illustrates only the main mechanisms or the like to be controlled by the process controller (CPU) 111, not all the mechanisms.

Figure 5:
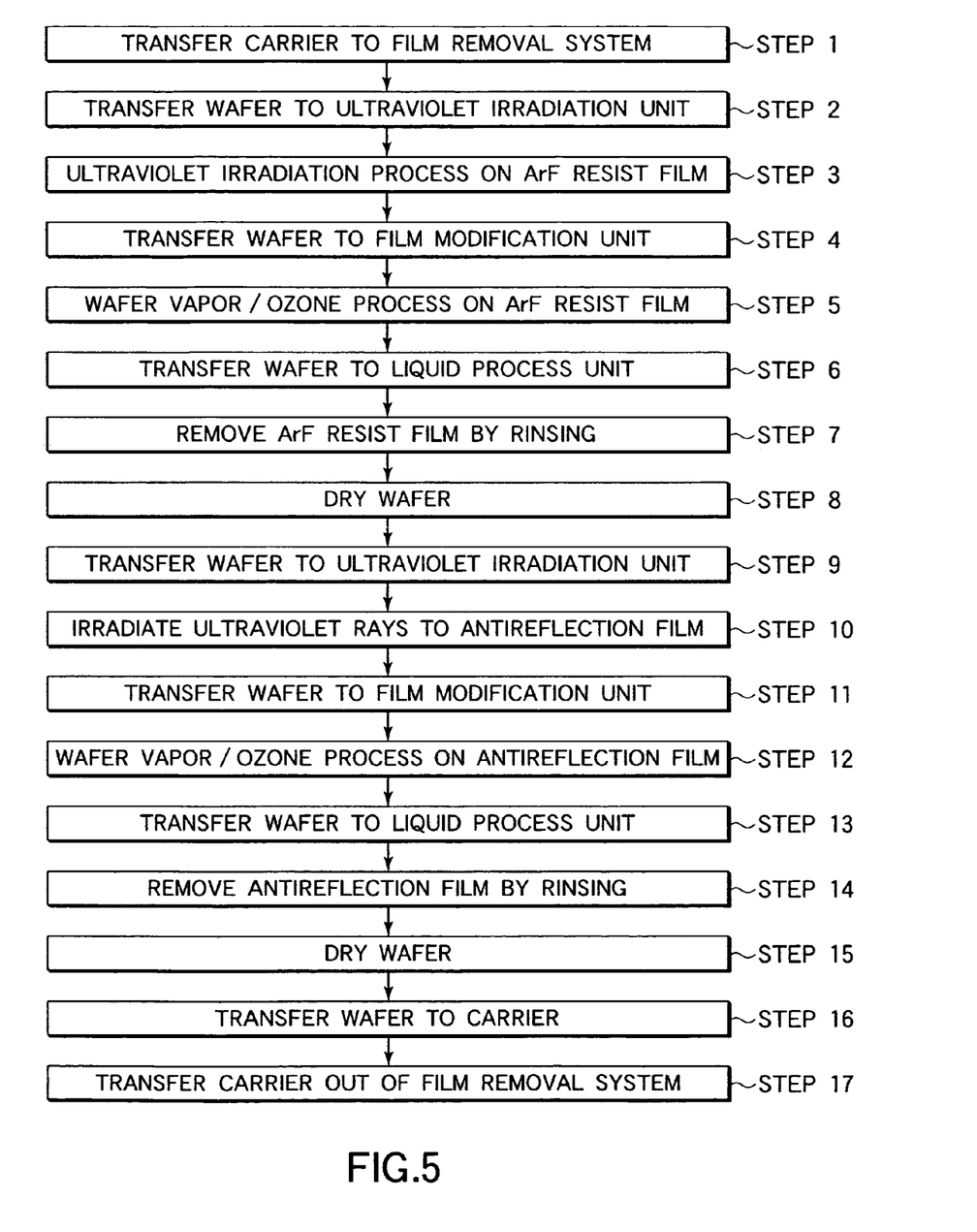
FIG. 5 is A flow chart showing a removal process of an ArF resist film and an antireflection film.

Next, methods of removing an ArF resist film or the like formed on a wafer W using the above-described film removal system 100 will be described with first to fifth methods exemplified. First, the first method separately removes an ArF resist film, which has a predetermined circuit pattern formed on the surface of a layer to be etched, and an antireflection film 65. FIG. 5 shows a schematic flowchart for the first method. FIGS. 6A to 6E are cross-sectional views exemplarily showing the removing process for an ArF resist film 66.

Figure 6A:
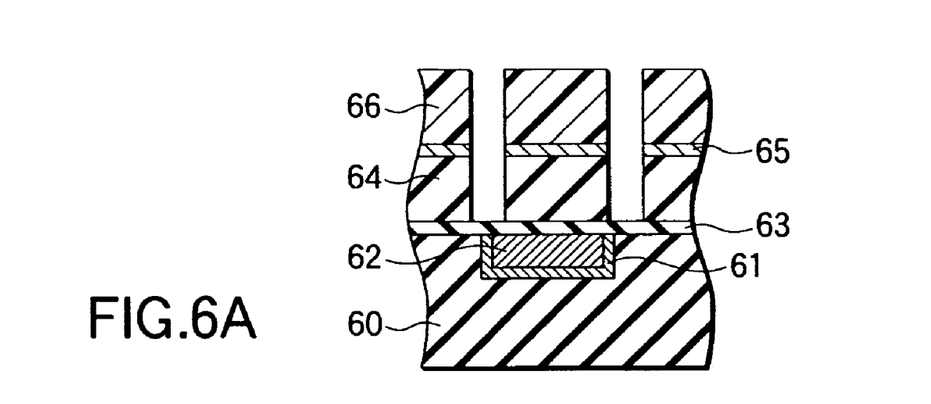
FIG. 6A is A cross-sectional view exemplarily showing a removal process for the ArF resist film.

FIG. 6A shows a wafer (substrate is not shown) that has an insulating film 60 on which a lower wiring (e.g., a copper wire) 62 is formed via a barrier metal layer 61, a stopper film (e.g., an SiN film, SiC film) 63, an insulating film (e.g., an $SiO_2$ film) 64, an antireflection film 65 compatible with ArF, and the ArF resist film 66. A circuit pattern like that of the ArF resist film 66 is formed on the insulating film 64 by, for example, dry etching.

A carrier C retaining the wafers is mounted on the stage 6 provided at the carrier station 4 of the film removal system 100 process station 2 by an operator or an automatic transfer apparatus (step 1). A predetermined wafer is unloaded from the carrier C by the main wafer transfer apparatus 14, is transferred to the wafer mount unit (TRS) 18b from which the wafer is transferred to the ultraviolet irradiation unit (UV) 19 and mounted on the stage 22 by the main wafer transfer apparatus 14 (step 2).

In the ultraviolet irradiation unit (UV) 19, with the oxygen concentration inside the casing 21 being reduced to a predetermined value or lower by an $N_2$ gas fed into the casing 21, ultraviolet rays are irradiated toward the stage 22 from the ultraviolet light source 25, and the stage 22 is scanned horizontally at a predetermined speed at this time, thereby uniformly irradiating the ultraviolet rays to the entire surface of the wafer mounted on the stage 22 (step 3).

Figure 6B:
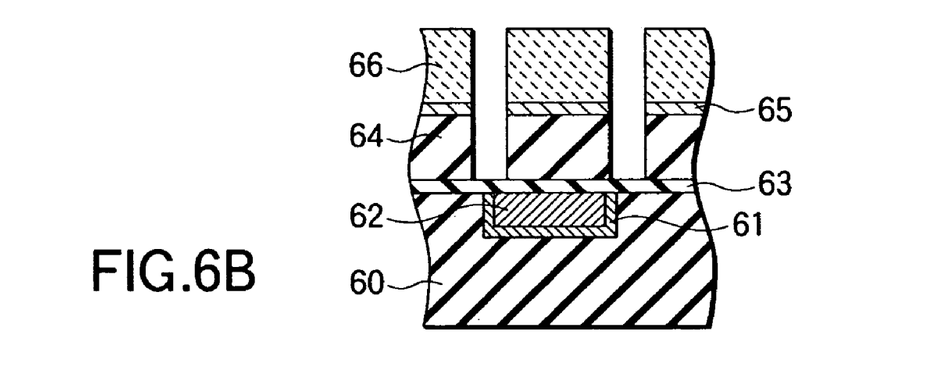
FIG. 6B is A cross-sectional view exemplarily showing the removal process for the ArF resist film.

This ultraviolet irradiation process changes the ArF resist film formed on the wafer to have such a property as to be water-soluble by the reaction of an $O_3$ gas and water vapor, which is executed later. FIG. 6B exemplarily shows the state after the process at step 3. To increase the amount of irradiation of ultraviolet rays to the wafer, the intensity of the ultraviolet rays to be irradiated from the ultraviolet light source 25 should be increased, or the scan speed of the stage 22 should be slowed, or the number of scans on the wafer should be increased.

The wafer that has undergone the ultraviolet irradiation process is transferred to the film modification unit (VOS) 15a (or any one of 15b to 15h) from the ultraviolet irradiation unit (UV) 19 by the main wafer transfer apparatus 14 (step 4). In the film modification unit (VOS) 15a, the heaters 45a, 45b provided in the chamber 30 normally generate heat, and after the temperature distribution of the wafer W retained in the chamber 30 becomes uniform, only the $O_3$ gas is fed into the chamber 30 from the $O_3$ gas feeder 27 first to purge the interior of the chamber 30, making the internal pressure of the chamber 30 to a predetermined positive pressure (i.e., higher than the external pressure of the chamber 30 (normally, the atmospheric pressure)).

If the temperature of the lid 41b is set higher by a predetermined temperature than the temperature of the stage 33, the density of the water vapor in the chamber 30 becomes higher on the stage 33 side than on the lid 41b side when the water vapor is fed into the chamber 30 later, making it possible to efficiently apply the water vapor to the wafer W.

Thereafter, with feeding of the $O_3$ gas maintained, the water vapor is fed to the chamber 30 from the water vapor feeder 28 (step 5) during which the feed amounts of the $O_3$ gas and the water vapor to the chamber 30 and the discharge amounts thereof from the chamber 30 are adjusted in such a way that dew condensation does not occur in the chamber 30 and the pressure in the chamber 30 becomes a predetermined positive pressure. The $O_3$ gas and the water vapor can alter the ArF resist film 66 formed on the wafer and a polymer residue adhered to the wafer (e.g., a polymer residue produced after the etching process) into a water-soluble state. If dew condensation occurs on the surface of the wafer W, dissolving of the resist with wafer at the liquid-droplets formed portion starts, so that the modification state becomes uneven, thus producing a resist residue.

Figure 6C:
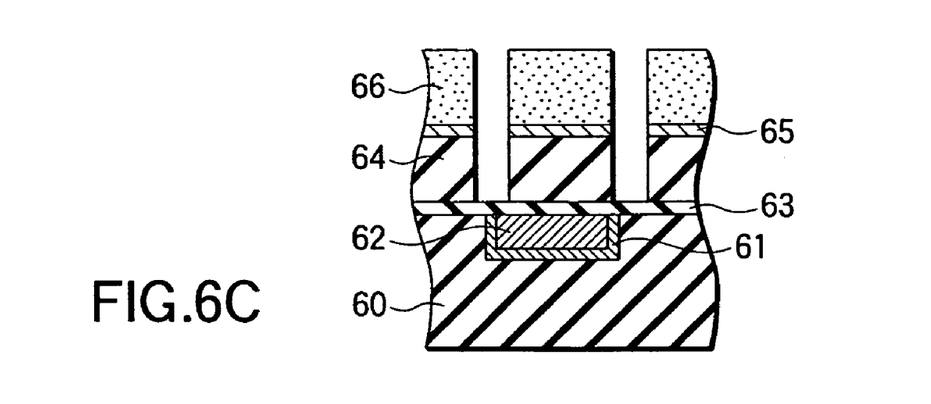
FIG. 6C is A cross-sectional view exemplarily showing the removal process for the ArF resist film.

FIG. 6C exemplarily shows the state in which the process at step 5 is finished and the ArF resist film is altered. Note that "the ArF resist film is altered into a water-soluble state" means that the property of the ArF resist film changes to be easily dissolved with pure water with the ArF resist film remaining on the wafer. Although the $O_3$ gas and the water vapor alter the ArF resist film 66 and the polymer residue, they do not damage the insulating film 64.

When processing of the wafer W with the $O_3$ gas and the water vapor is finished, the feeding of the $O_3$ gas and the water vapor to the chamber 30 is stopped, the $N_2$ gas is fed into the chamber 30 from the $N_2$-gas feeding apparatus 29 to purge the interior of the chamber 30. If a large amount of $N_2$ gas is fed into the chamber 30 rapidly at this time, a drastic pressure change in the chamber 30 may cause dew condensation on the wafer W, so that it is preferable to set the supply flow rate of the nitrogen gas relatively small first, and increase the supply flow rate of the nitrogen gas and increase the discharge flow rate after a constant amount of $N_2$ gas is fed into the chamber 30. This can shorten the time of purging with the $N_2$ gas. In the $N_2$ gas purge, the $O_3$ gas is completely discharged from inside the evacuation apparatus 32 so that the $O_3$ gas does not counterflow from the evacuation apparatus 32 and is not discharged from the chamber 30 when the chamber 30 is opened later.

When the $N_2$ gas purge in the chamber 30 is finished, the chamber 30 is opened after confirming that the internal pressure of the chamber 30 and the external pressure are equal to each other. After the processing at step 5, the ArF resist film is altered into a water-soluble state, but is not removed from the wafer W. Accordingly, to rinse the altered ArF resist film and remove the film from the wafer W, the wafer W is transferred out of the film modification unit (VOS) 15a and is transferred to the liquid process unit (LCU) 12a (or any one of 12b to 12d) by the main wafer transfer apparatus 14 (step 6).

Figure 6D:
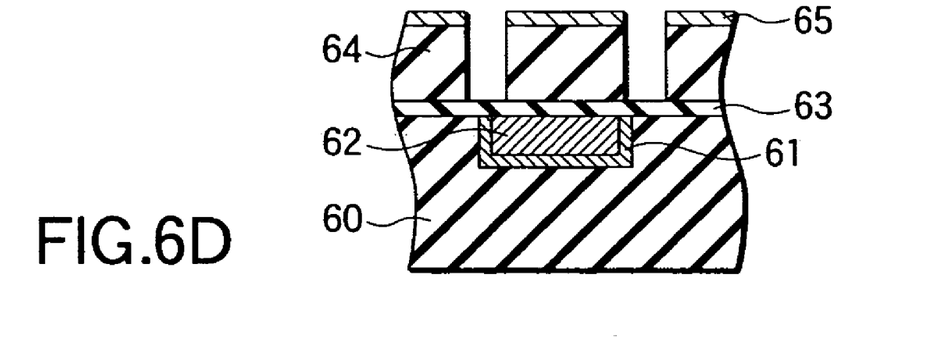
FIG. 6D is A cross-sectional view exemplarily showing the removal process for the ArF resist film.

In the liquid process unit (LCU) 12a, the ArF resist film is removed from the wafer by rotating the wafer while feeding a constant amount of pure water to the surface of the wafer held in approximately the horizontal state (step 7). FIG. 6D exemplarily shows the state after the process at step 7. In the process at step 7, the polymer residue is removed from the wafer too. When the rinse process at step 7 is finished, the wafer W is rotated at a high speed to spin-dry the wafer W (step 8). It is preferable that the process at the step 8 should be executed while the $N_2$ gas is sprayed onto the surface of the wafer W.

Figure 6E:
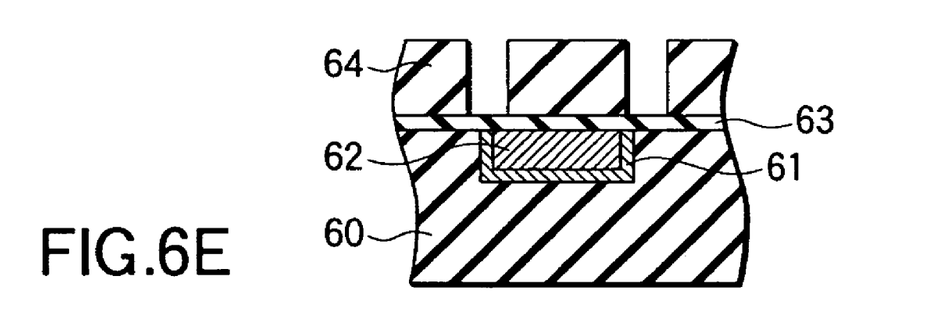
FIG. 6E is A cross-sectional view exemplarily showing the removal process for the ArF resist film.

When the process at step 8 is finished, the antireflection film 65 remains on the insulating film 64. To remove the antireflection film 65, therefore, the process that has previously been performed on the ArF resist film is repeated. That is, the wafer W undergone the process at step 8 is transferred to the ultraviolet irradiation unit (UV) 19 (step 9) where ultraviolet rays are irradiated on the antireflection film 65 (step 10), then the wafer W is transferred from the ultraviolet irradiation unit (UV) 19 to the film modification unit (VOS) 15a (step 11), and the antireflection film 65 is altered into a water-soluble form by the $O_3$ gas and the water vapor (step 12). Subsequently, the wafer W is transferred from the film modification unit (VOS) 15a to the liquid process unit (LCU) 12a (step 13), the wafer W is rinsed to remove the altered antireflection film 65 (step 14), and the wafer W is spin-dried (step 15). The antireflection film 65 can be removed off from the insulating film 64 in this manner. FIG. 6E exemplarily shows the state after the process at step 15.

The wafer W from which the ArF resist film 66 and the antireflection film 65 are removed this way is transferred out of the liquid process unit (LCU) 12a and transferred to the wafer mount unit (TRS) 18a by the main wafer transfer apparatus 14, and is returned to the carrier C from there by the wafer transfer apparatus 7 (step 16). When the wafers W which have been transferred out of the carrier C and have undergone the processing in the film removal system 100 are all returned to the carrier C, the carrier C is transferred to the apparatus or the like which performs the next process on the wafers W (step 17).

It is apparent that when the antireflection film is exposed to the surface of the wafer W, the first method can be used to remove only the antireflection film. In this case, the antireflection film is not limited to an antireflection film compatible with ArF, but may be compatible with KrF rays or g rays. Although such an antireflection film compatible with KrF rays or g rays is conventionally removed by CMP or dry ashing, the first method can remove the antireflection film 65 in a short period of time. As the wafer W need not be transferred to the apparatus which performs CMP or dry ashing, it is possible to reduce the total process time, process cost, and apparatus cost.

Next, examples according to the first method and an comparative example will be explained. A plurality of wafers having an ArF resist film formed thereon were prepared. In the examples, the ultraviolet irradiation process by the ultraviolet irradiation unit (UV) 19, the process with the $O_3$ gas and the water vapor in the film modification units (VOS) 15a to 15h, and the rinse process and the spin drying process in the liquid process units (LCU) 12a to 12d were performed on those wafers, and the removing rates of the resist films or the like were checked.

The processes in the ultraviolet irradiation unit (UV) 19 were performed under the conditions where the wafers were scanned using an excimer laser with an emission wavelength of 172 nm was as the ultraviolet light source 25, the discharge frequency was set to 2000 kHz or 150 kHz, and the temperature of the wafers was set to (25° C.) or 100° C. The process conditions in the film modification units (VOS) 15a to 15h were the ozone gas concentration of 200 g/Nm$^3$, the $O_3$ gas flow rate of 4 L/min, the chamber temperature of 115° C., the chamber pressure of 75 kPa, the water vapor flow rate of 8 mL/min, the water vapor temperature of 120° C., the water vapor pressure of 95 kPa, and the feeding time of the $O_3$ gas and the water vapor being 60 seconds. The $N_2$ gas was fed to the chamber 30 at 4 mL/min at the same time as the $O_3$ gas was fed.

As a comparative example, wafers having an ArF resist film formed thereon were processed by the film modification units (VOS) 15a to 15h under the same conditions as those of the examples without executing the ultraviolet irradiation process, and rinsing and spin drying were performed by the liquid process units (LCU) 12a to 12d, then the removing rates of the resist films or the like were checked.

Figure 7:
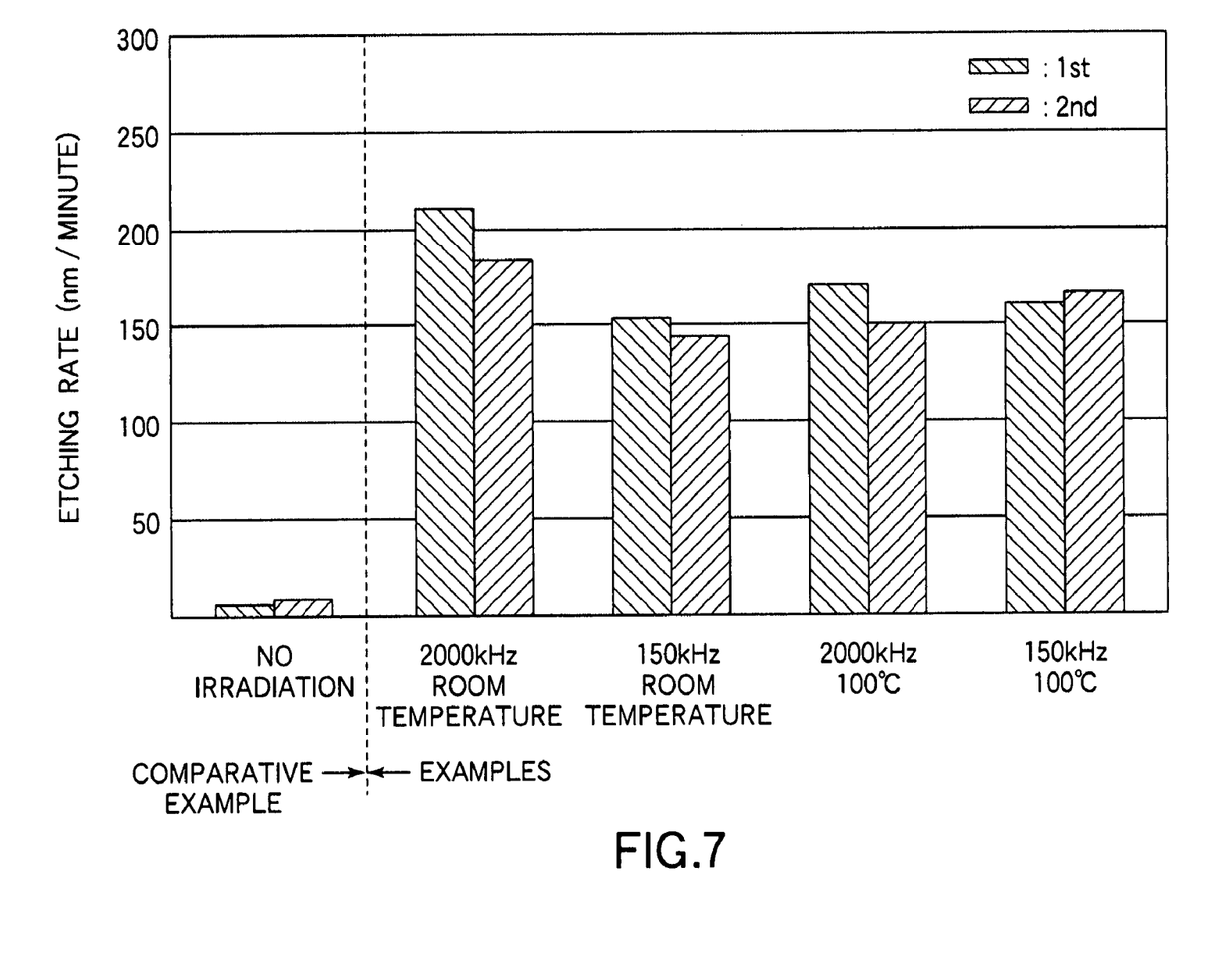
FIG. 7 is A graph showing separation rates of an embodiment and a comparative example by comparison.

FIG. 7 shows a graph comparing the removing rates of the embodiment with those of the comparative example. Measuring the removing rate is performed twice for each of the examples and the comparative example. As apparent from FIG. 7, the removing rate is extremely low in the comparative example which does not perform the ultraviolet irradiation process, so that in practice, the processing method of the comparative example cannot be used in the semiconductor-device fabrication process. According to the examples, by way of contrast, while the temperature of the wafers hardly influence the removing rate, the removing rate tends to increase when the discharge frequency is high, and the removing rate obtained is as high as about 35 to 50 times that of the comparative example. From this, it seems that the ultraviolet irradiation process has changed the property of the ArF resist film in such a way that the ArF resist film is likely to be water-soluble by the process with the $O_3$ gas and the water vapor. However, the principle of altering the ArF resist film in the ultraviolet irradiation process is not apparent. The processing method of the embodiment can be substantially used in the semiconductor-device fabrication process.

Although the first method separately removes the antireflection film 65 and the ArF resist film 66, the second method simultaneously removes the antireflection film 65 and the ArF resist film 66. In the second method, the processes are executed in the order of steps 1 to 8, 16 and 17 illustrated in FIG. 5, but the process at step 3 is executed with the ultraviolet irradiation amount (intensity) in the ultraviolet irradiation process being increased. The second method can be used when other portions than the antireflection film 65 and the ArF resist film 66 are not damaged by ultraviolet irradiation.

Figure 8:
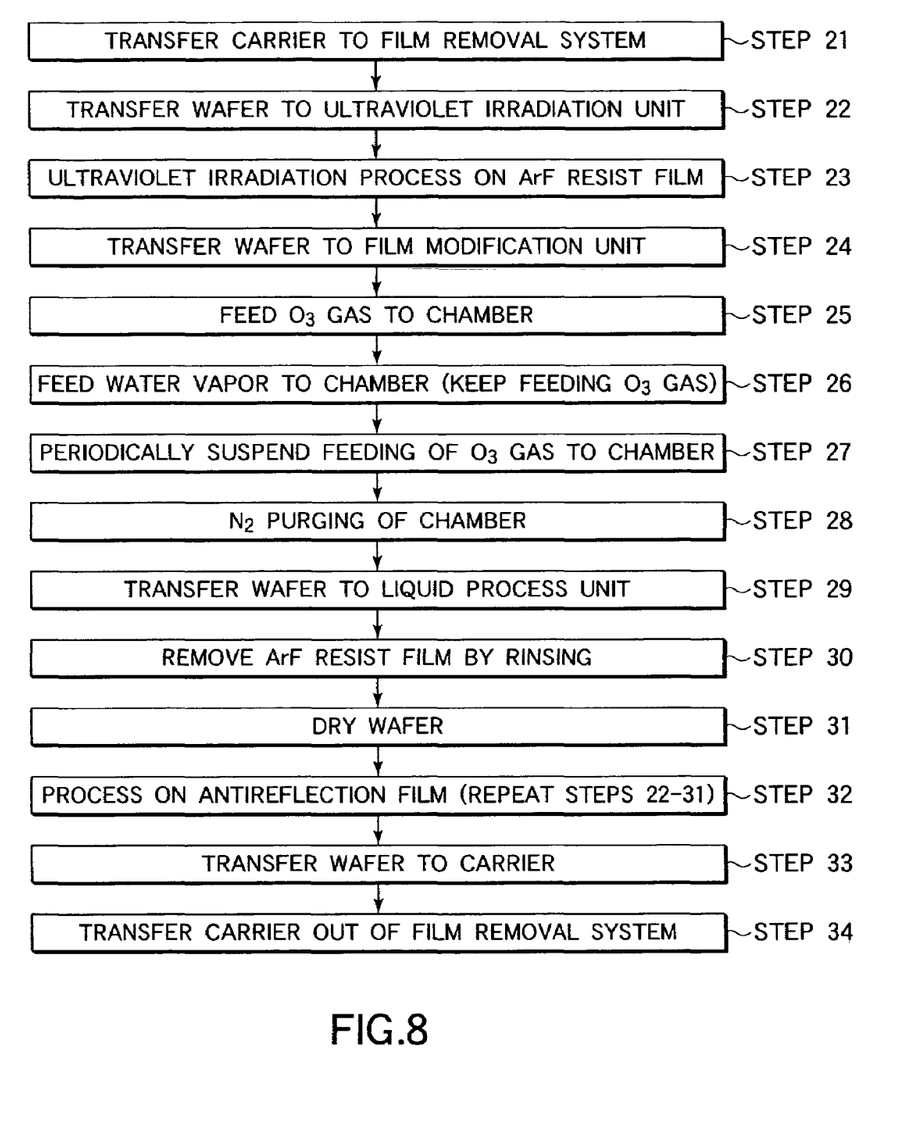
FIG. 8 is A flowchart showing another removal method for an ArF resist film and an antireflection film.

Next, the third method will be described. FIG. 8 illustrates a flowchart for a schematic removing process for the ArF resist film and the antireflection film according to the third method. Although the third method, like the first method, separately removes the ArF resist film, which has a predetermined circuit pattern formed on the surface of a layer to be etched, and the antireflection film, it differs in the method of processing the wafer W in the film modification unit (VOS) 15a with the $O_3$ gas and the water vapor, and this point will be explained in detail.

The wafer W for which the ultraviolet irradiation process on the ArF resist film has finished according to steps 21 to 24 that are the same processes as those of the steps 1 to 4 shown in FIG. 5 is transferred to the film modification unit (VOS) 15a. Next, when the temperature distribution of the wafer W retained in the chamber 30 becomes nearly constant, the $O_3$ gas is fed into the chamber 30 at a constant flow rate to pressurize the interior of the chamber 30 (step 25). Next, the water vapor is fed into the chamber 30 at a constant flow rate while feeding the $O_3$ gas at a constant flow rate (step 26).

At step 26, the discharge amount from the chamber 30 is adjusted to keep the pressure in the chamber 30 constant so as not to cause dew condensation in the chamber 30. This is because if dew condensation occurs on the surface of the wafer W, dissolving of the resist at the portion where water droplets are produced starts, so that the modification state becomes uneven, thus producing a resist residue.

More specifically, the prevention of dew condensation is carried out as follows. That is, the pressure at which dew condensation occurs in the chamber 30 when the amount of the water vapor to be fed to the chamber 30 is set constant with the temperature in the chamber 30 held at a predetermined temperature is acquired beforehand, and the process pressure value is set smaller than the pressure value, and those are added to information in the recipe 116. Then, referring to the value measured by the pressure sensor 48, the process controller (CPU) 111 controls the discharge flow rate from the chamber 30 in such a way that the pressure in the chamber 30 does not exceed the pressure at which dew condensation occurs, and is kept at the set pressure value.

Then, the state where there are lots of water molecules is periodically created in the chamber 30 by periodically suspending the feeding of the $O_3$ gas while keeping feeding the water vapor into the chamber 30 (step 27). For example, a process of stopping the feeding of the $O_3$ gas when 15 seconds have elapsed since the beginning of the feeding of the water vapor, and keeping the state for 5 seconds, then resuming the feeding of ozone gas and keeping the state for 15 seconds, and then stopping the feeding of ozone gas and keeping the state for 5 seconds is repeated plural times. At the step 27, although the total amount of the gas to be fed to the chamber 30 changes periodically, the pressure in the chamber 30 is kept at a constant pressure by controlling the discharge flow rate from the chamber 30 by referring to the value measured by the pressure sensor 48 as mentioned above.

In the processes at the steps 26 and 27, the molecules of the $O_3$ gas and water attack the carbon atoms constituting the ArF resist film (the carbon atoms of the resist material) and change the ArF resist film into a water-soluble state.

It is preferable that the process at step 27 should end with a small amount of water vapor in the chamber 30 from the viewpoint of preventing occurrence of dew condensation. Therefore, with the $O_3$ gas and water vapor fed into the chamber 30, the feeding of both the $O_3$ gas and water vapor into the chamber 30 is stopped, and the $N_2$ gas is fed into the chamber 30 to purge the interior of the chamber 30 with the $N_2$ gas (step 28). After the process at step 28 ends, the wafer W is transferred to the liquid process unit (LCU) 12a (or any one of 12b to 12d) from the film modification unit (VOS) 15a to execute a rinse process for removing the ArF resist film altered into a water-soluble state from the wafer W (step 29).

Thereafter, the rinse process at step 30 and the drying process at step 31, which are the same processes at steps 7 and 8 in the above-described first method are executed. Next, the same processes at those of steps 22 to 31 are repeated on the antireflection film (step 32), so that the wafer W from which the antireflection film has been removed is returned to the carrier C (step 33), then the carrier C is transferred to the apparatus or the like which performs the next process on the wafer W (step 34).

In case where resist films were formed on two wafers W using the same resist material, one of them was processed by the first method while the other one was processed by the third method, the process times with ozone gas and water vapor which could completely remove the resist film in the rinse process were checked, showing that the process time equal to or less than 80% of the process time in the first method was sufficient in the third method. It is presumed that this occurs because the creation of the atmosphere where there are lots of water molecules produces a lot of easily modifiable portions on the resist film. Dew condensation is likely to occur if the interior of the chamber 30 is always kept to a state where there is a lot of water vapor, the method that periodically stops feeding the $O_3$ gas restrains the occurrence of dew condensation, or feeds the $O_3$ gas which is needed for modification to the chamber 30 so that the $O_3$ gas does not become short. Therefore, the $O_3$ gas is not consumed wastefully, and, what is more, the efficiency of altering the resist film is improved.

Step 27 of the third method may employ a scheme of periodically reducing the flow rate of the $O_3$ gas, not periodically completely stopping feeding the $O_3$ gas in the above-described manner. The cycle of stopping feeding the $O_3$ gas or reducing the flow rate thereof should not necessarily be constant, but the first feeding stop time may differ from the next feeding stop time.

Like the second method of simultaneously separating the ArF resist film and the antireflection film as a modification of the above-described first method, the fourth method simultaneously removes the ArF resist film and the antireflection film by increasing the amount (intensity) of ultraviolet irradiation.

While the above-described first to fourth methods are used in case where the film to be removed is changed into a water-soluble form by the ultraviolet irradiation process and the subsequent process with the $O_3$ gas and water vapor, some of ArF resist films and antireflection films may not easily be separated from a wafer W, or may take a longer process time and are not practical, if they can be separated. Accordingly, the fifth method easily removes such a film from a wafer W.

The fifth method is a processing method where the rinse process which is executed in each of the first to fourth methods is changed to a process using an alkaline chemical liquid, and the other processes are not changed. The fifth method performs a rinse process of feeding an alkaline chemical liquid to a wafer W to removes the resist film and the antireflection film that are to be removed in the liquid process unit (LCU) 12a, then rinsing off the alkaline chemical liquid with pure water, and then spin-drying the wafer W.

As the alkaline chemical liquid in use in the fifth method, an APM (ammonia-hydrogen-peroxide-water solution), an ammonium hydroxide aqueous solution (aqueous ammonia), and a tetramethyl ammonium hydroxide (TMAH) aqueous solution can be preferably used. It is presumed that an alkaline group ($NH_4^+$, $K^+$ or the like) which is contained in those alkaline aqueous solution but is not substantially contained in pure water easily combined to the molecules of the resist film altered by ozone gas and water vapor, and dissolves the film. The alkaline chemical liquid is not limited to an aqueous solution, but may be an organic type.

In case where the fifth method is used, when a metal like tungsten is exposed to the process surface, it is necessary to select an alkaline chemical liquid which does not damage the metal. An ammonium hydroxide aqueous solution and TMAH solution are suitable as such an aqueous solution. This is because an APM solution contains hydrogen peroxide, which would damage the metal.

Even in the fifth method, the conditions such as the feed amount of water vapor are adjusted in the process with the $O_3$ gas and water vapor in such a way as not to cause dew condensation on a wafer W. This is because according to the fifth method, if dew condensation occurs in the process with the $O_3$ gas and water vapor, that portion of a film to be removed which is directly under the water droplets cannot be altered, and a resist residue is produced after the later process with the alkaline chemical liquid.

Although the methods of removing an ArF resist film and an antireflection film have been described above, the first to fifth methods can remove a resist film hardened by ion implantation, particularly, a resist film ion-implanted so that the ion dosage becomes $10^{15}/cm^2$ or greater, at a high separation rate. In this case, the resist film is not limited to the ArF resist film, but may be a resist film compatible with g rays or KrF rays. A resist film ion-implanted at a high dosage should conventionally be removed by dry ashing, at which time the circuit pattern may be damaged. The first to fifth methods can however remove a high-dose-ion-implanted resist film while suppressing damaging on the circuit pattern. Whether to use pure water or an alkaline chemical liquid after the process with the $O_3$ gas and water vapor has only to be selected according to the ion dosage and the solubility of the resist film with each liquid.

Although the embodiment of the invention has been explained, the invention is not limited to this mode. For example, although the illustrated film removal system 100 is constructed to dispose a unit which process wafers W one by one (so-called a single wafer type unit) in the process station 2, a unit which processes plural (e.g., 25) wafers W at a time (so-called a batch type unit) may be disposed for the process with the $O_3$ gas and water vapor and the rinse process, for example. Although a semiconductor wafer is illustrated as a substrate in the foregoing description, the substrate is not limited to this type, but may be a glass substrate for a flat panel display (FPD). The $O_3$ gas and water vapor may contain another component, e.g., hydrogen peroxide or the like.

The above-described embodiments are merely intended to make the technical contents of the invention apparent, and the invention is not to be restrictively construed only to such specific examples, but may be altered in various forms within the spirit of the invention and the scope of the claims.

INDUSTRIAL APPLICABILITY

The invention is suitable for a process of fabricating a semiconductor device or a flat panel display, and an apparatus therefor.

The invention claimed is:

1. A substrate processing method for removing an ArF resist film from a substrate having the ArF resist film, comprising the steps of:
   irradiating an ultraviolet ray having a predetermined wavelength to the ArF resist film;
   altering the ArF resist film irradiated with the ultraviolet ray into a water-soluble state by placing the substrate in a chamber and feeding an ozone gas and water vapor to the chamber; and
   removing the ArF resist film from the substrate by feeding pure water to the ArF resist film altered into the water soluble state,
   wherein when the water vapor and the ozone gas are fed to the chamber, a feed amount of ozone gas with respect to the water vapor is decreased while the water vapor is fed to said chamber at a constant flow rate in such a way as not to cause dew condensation on the substrate placed in the chamber.

2. The substrate processing method according to claim 1, wherein the substrate further has an antireflection film compatible with an ArF ray, and
   the antireflection film together with the ArF resist film is irradiated with an ultraviolet ray, becomes water-soluble by said ozone gas and the water vapor, and is collectively removed together with the ArF resist film from the substrate by the pure water.

3. A substrate processing method for removing an antireflection film from a substrate having said antireflection film, comprising the steps of:
   irradiating an ultraviolet ray having a predetermined wavelength to the antireflection film;
   altering the antireflection film irradiated with the ultraviolet ray into a water-soluble state by placing the substrate in a chamber and feeding an ozone gas and water vapor to the chamber; and
   removing said antireflection film from the substrate by feeding pure water to said reflection film altered into the water-soluble state,
   wherein when the water vapor and the ozone gas are fed to the chamber, a feed amount of ozone gas with respect to the water vapor is decreased while the water vapor is fed to said chamber at a constant flow rate in such a way as not to cause dew condensation on the substrate placed in the chamber.

4. A substrate processing method for removing a resist film from a substrate having the resist film undergone an ion implantation process at a high dose, comprising the steps of:
   irradiating an ultraviolet ray having a predetermined wavelength to said resist film;
   altering the resist film irradiated with the ultraviolet ray into a water-soluble state by placing the substrate in a chamber and feeding an ozone gas and water vapor to the chamber; and
   removing the resist film from the substrate by feeding pure water to the resist film altered into the water soluble state,
   wherein when the water vapor and the ozone gas are fed to the chamber, a feed amount of ozone gas with respect to the water vapor is decreased while the water vapor is fed to said chamber at a constant flow rate in such a way as not to cause dew condensation on the substrate placed in the chamber.

5. The substrate processing method according to claim 4, wherein a dosage in the ion implantation process is equal to or greater than $1 \times 10^{15}/cm^2$.

6. The substrate processing method according to claim 1, wherein feeding of the ozone gas to the chamber is periodically suspended.

7. The substrate processing method according to claim 1, wherein a pressure at which dew condensation occurs in the chamber is acquired beforehand, when an amount of the water vapor to be fed to the chamber is made constant with an interior of the chamber held at a predetermined temperature, and when the water vapor and the ozone gas are fed to the chamber, the feed amount of ozone gas is controlled while a pressure in the chamber is measured in such a way that the measured pressure does not exceed the pressure at which the dew condensation occurs.

8. The substrate processing method according to claim 1, wherein the chamber is evacuated in such a way as to keep an interior of the chamber at a constant positive pressure when the water vapor and the ozone gas are fed to the chamber.

9. A substrate processing method for removing an ArF resist film from a substrate having the ArF resist film, comprising the steps of:

irradiating an ultraviolet ray having a predetermined wavelength to the ArF resist film;

altering said ArF resist film irradiated with the ultraviolet ray in a such a way as to be soluble with a predetermined chemical solution by placing the substrate in a chamber and feeding an ozone gas and water vapor to the chamber; and removing the ArF resist film from the substrate by feeding the chemical liquid to the altered ArF resist film, wherein when the water vapor and the ozone gas are fed to the chamber, a feed amount of ozone gas with respect to the water vapor is decreased while the water vapor is fed to the chamber at a constant flow rate in such a way as not to cause dew condensation on the substrate placed in the chamber.

10. The substrate processing method according to claim 9, wherein the substrate further has an antireflection film compatible with an ArF ray, and the antireflection film together with the ArF resist film is irradiated with an ultraviolet ray, is altered by the ozone gas and the water vapor, and is collectively removed together with the ArF resist film from the substrate by the chemical solution.

11. A substrate processing method for removing an antireflection film from a substrate having the antireflection film, comprising the steps of:

irradiating an ultraviolet ray having a predetermined wavelength to the antireflection film;

altering said antireflection film irradiated with the ultraviolet ray in a such a way as to be soluble with a predetermined chemical liquid by placing the substrate in a chamber and feeding an ozone gas and water vapor to the chamber; and removing the antireflection film from the substrate by feeding the chemical liquid to the altered antireflection film, wherein when the water vapor and the ozone gas are fed to the chamber, a feed amount of ozone gas with respect to the water vapor is decreased while the water vapor is fed to the chamber at a constant flow rate in such a way as not to cause dew condensation on the substrate placed in the chamber.

12. A substrate processing method for removing a resist film from a substrate having the resist film undergone an ion implantation process at a high dose, comprising the steps of:

irradiating an ultraviolet ray having a predetermined wavelength to the resist film;

altering the resist film irradiated with the ultraviolet ray in a such a way as to be soluble with a predetermined chemical liquid by placing said substrate in a chamber and feeding an ozone gas and water vapor to the chamber; and removing the resist film from the substrate by feeding the chemical liquid to the altered resist film, wherein when the water vapor and the ozone gas are fed to the chamber, a feed amount of ozone gas with respect to the water vapor is decreased while the water vapor is fed to the chamber at a constant flow rate in such a way as not to cause dew condensation on the substrate placed in the chamber.

13. The substrate processing method according to claim 12, wherein a dosage in said ion implantation process is equal to or greater than $1 \times 10^{15}/cm^2$.

14. The substrate processing method according to claim 9, wherein feeding of the ozone gas to the chamber is periodically suspended.

15. The substrate processing method according to claim 9, wherein a pressure at which dew condensation occurs in the chamber is acquired beforehand, when an amount of the water vapor to be fed to the chamber is made constant with an interior of the chamber held at a predetermined temperature, and when the water vapor and the ozone gas are fed to the chamber, the feed amount of ozone gas is controlled while a pressure in the chamber is measured in such a way that the measured pressure does not exceed the pressure at which the dew condensation occurs.

16. The substrate processing method according to claim 9, wherein the chamber is evacuated in such a way as to keep an interior of the chamber at a constant positive pressure when the water vapor and the ozone gas are fed to the chamber.

17. The substrate processing method according to claim 9, wherein the chemical liquid is an alkaline chemical liquid.

18. The substrate processing method according to claim 17, wherein the alkaline chemical liquid is any one of an APM solution, an ammonium hydroxide aqueous solution, or a tetramethyl ammonium hydroxide (TMAH) aqueous solution.

19. The substrate processing method according to claim 1, wherein an ultraviolet lamp or an excimer laser with a wavelength of 172 nm to 193 nm is used for ultraviolet irradiation.

20. A computer-readable memory medium having stored a program which causes a computer to controls a substrate processing apparatus which processes a substrate placed in a chamber having a heating mechanism with water vapor and ozone gas to execute the processes of (a) placing a substrate having any one of an ArF resist film, an antireflection film, and a high-dose-ion-implanted resist film, which has undergone an ultraviolet irradiation process in the chamber, (b) keeping an interior of the chamber at a predetermined temperature, and (c) altering the film so as to be soluble with a predetermined process liquid by reducing a feed amount of ozone gas into the chamber while the water vapor is fed into the chamber at a constant flow rate in such a way as not to cause dew condensation on the substrate.

21. The computer-readable memory medium according to claim 20, wherein the program causes the computer to control the substrate processing apparatus so as to periodically suspend feeding of the ozone gas to the chamber.

22. The substrate processing method according to claim 3, wherein feeding of the ozone gas to the chamber is periodically suspended.

23. The substrate processing method according to claim 4, wherein feeding of the ozone gas to the chamber is periodically suspended.

* * * * *